United States Patent
Mabuchi

(10) Patent No.: US 7,663,923 B2
(45) Date of Patent: Feb. 16, 2010

(54) SEMICONDUCTOR MEMORY DEVICE AND CONTROL METHOD THEREOF

(75) Inventor: Syuji Mabuchi, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/438,324

(22) Filed: May 23, 2006

(65) Prior Publication Data
US 2007/0195574 A1 Aug. 23, 2007

(30) Foreign Application Priority Data
Feb. 17, 2006 (JP) .............................. 2006-040186

(51) Int. Cl.
G11C 16/04 (2006.01)
(52) U.S. Cl. .................. 365/185.18; 365/186; 365/218; 365/104; 365/185.25; 365/185.26
(58) Field of Classification Search ............ 365/185.18, 365/186, 218, 104, 185.25, 185.26
See application file for complete search history.

(56) References Cited

U.S. PATENT DOCUMENTS

| | | | | |
|---|---|---|---|---|
| 4,399,523 A * | 8/1983 | Gerber et al. | .......... | 365/185.18 |
| 4,434,478 A * | 2/1984 | Cook et al. | ............ | 365/185.18 |
| 4,597,064 A * | 6/1986 | Giebel | .................... | 365/185.13 |
| 4,792,925 A * | 12/1988 | Corda et al. | ........... | 365/185.16 |
| 4,996,571 A * | 2/1991 | Kume et al. | ............ | 365/185.19 |
| 5,222,040 A * | 6/1993 | Challa | .................... | 365/185.24 |
| 5,267,209 A * | 11/1993 | Yoshida | .................. | 365/185.27 |
| 5,289,416 A * | 2/1994 | Iwai et al. | .................... | 365/200 |
| 6,449,188 B1 * | 9/2002 | Fastow | .................. | 365/185.18 |
| 7,236,403 B2 * | 6/2007 | Deml et al. | ............ | 365/185.25 |

FOREIGN PATENT DOCUMENTS

| | | |
|---|---|---|
| JP | 09-007382 | 1/1997 |
| JP | 2004-158111 | 6/2004 |

* cited by examiner

*Primary Examiner*—Amir Zarabian
*Assistant Examiner*—Fernando N Hidalgo
(74) *Attorney, Agent, or Firm*—Arent Fox LLP

(57) ABSTRACT

This invention provides a semiconductor memory device in which standby current is suppressed to a small level. A ROM device includes memory cells for reading data corresponding to impedance between a terminal connected to bit lines and a source terminal and source power lines connected to the source terminal. In this ROM device, bias voltage is applied between the terminals of selected memory cells.

15 Claims, 6 Drawing Sheets

CIRCUIT DIAGRAM OF ROM DEVICE OF FIRST EMBODIMENT

CIRCUIT DIAGRAM OF ROM DEVICE OF FIRST EMBODIMENT

CIRCUIT DIAGRAM OF SPECIFIC EXAMPLE OF DRIVE CIRCUIT

CIRCUIT DIAGRAM OF ANOTHER EXAMPLE OF DRIVE CIRCUIT

FIG.5 CIRCUIT DIAGRAM OF ROM DEVICE OF SECOND EMBODIMENT

CIRCUIT DIAGRAM OF SPECIFIC EXAMPLE OF FIRST ROW DECODER

CIRCUIT DIAGRAM OF SPECIFIC EXAMPLE OF SECOND ROW DECODER

CIRCUIT DIAGRAM OF CONVENTIONAL ROM DEVICE

SEMICONDUCTOR MEMORY DEVICE AND CONTROL METHOD THEREOF

CROSS-REFERENCE TO RELATED APPLICATIONS

This application is based upon and claims the benefit of priority from each of the prior Japanese Patent Application No. 2006-040186 filed on Feb. 17, 2006, the entire contents of which are incorporated herein by reference.

BACKGROUND OF THE INVENTION

1. Field of the Invention

The present invention relates to a semiconductor memory device of a type from which stored data is read out, such as Read-Only Memory (ROM) and Erasable and Programmable Read-Only Memory (EPROM).

2. Description of the Related Art

FIG. 8 is a circuit diagram showing the structure of a conventional ROM device 100. This ROM device 100 is a mask ROM in which data is programmed preliminarily when the mask is produced and comprises memory cells M00-M0$n$, M10-M1$n$, bit line BL0 connected to the memory cells M00-M0$n$, bit line BL1 connected to the memory cells M10-M1$n$ and word lines WL0-WLn connecting a row selecting transistors of the respective memory cells in the row direction (horizontal direction in FIG. 8). The memory cell M00 includes a row-selecting transistor TR00 whose source is connected to the bit line BL and a data switch SW00 whose an end is connected to a drain of the row selecting transistor TR00. The data switch SW00 is so constructed that the other end is opened or connected to VSS depending on a mask pattern upon manufacturing.

A pre-charge switch SWP0 and a column selecting switch SWC0 are connected to the bit line BL0. Other bit line such as the bit line BL1 has the same structure as the bit line BL0. The other end of the column selecting switch SWC0 is connected to an input of a sense amplifier AMP as well as the other end of the column selecting switch connected to the other bit line.

The column selecting switch is controlled by conduction of a corresponding column selecting signal. For example, the column selecting switch SWC0 is controlled to be conductive when a column selecting signal CL0 changes to low level. The corresponding column selecting signals are controlled to be excluded for each bit line. As a consequence, if a specific column selecting signal is activated, the level of a corresponding bit line is transmitted to the input of the sense amplifier AMP.

Next, the reading operation of the ROM device 100 will be described.

Upon standby for reading out, with the word lines WL0-WLn maintained at the low level, pre-charge control signal BLR is turned to low level. As a consequence, the pre-charge switches SWP0-SWPm become conductive so that the parasitic capacities of the bit lines BL0-BLm are charged to high level (this operation is called pre-charge of bit line).

The read-out can be carried out by changing a word line corresponding to a memory cell from which data is to be read out and changing a corresponding column selecting signal to low level.

When reading out data of the memory cell M00, the row selecting transistor TR00 and the column selecting switch SWC0 become conductive by changing the word line WL0 to high level and the column selecting signal CL0 to low level so that low level is outputted to the input of the sense amplifier AMP.

As a related ROM device, technologies disclosed in Japanese unexamined patent publication No. H9(1997)-7382 and Japanese unexamined patent publication No. 2004-158111 can be mentioned.

SUMMARY OF THE INVENTION

When the ROM device is loaded on system LSI, an initial program and initial data are stored in the ROM device and after reading from it is completed once, it is kept in standby condition while rarely accessed. In such a case, as for consumption current of the ROM device, standby current which is a current at the time of standby occupies a large ratio as compared with an operating current for reading operation.

However, because in the aforementioned ROM device 100, pre-charge level is applied to the bit line during standby for reading, leak current is generated due to leak between S and D in a memory cell in which low level is programmed. Particularly, in a semiconductor device activated under a low power source voltage often seen in recent years, the leak between S and D tends to increase so that the standby current due to the leak current increases, thereby leading to a problem to be solved.

The present invention has been achieved in views of the above-described background art and an object of the invention is to provide a semiconductor memory device in which the standby current is suppressed to a low level.

To solve the above problem, there is provided a semiconductor memory device comprising: memory cells from which data is read out depending on impedance between a terminal connected to a bit line and a source terminal; and source power lines connected to the source terminals of the memory cell, wherein upon reading, bias voltage is applied between the terminals of the selected memory cells.

To solve the above problem, there is also provided a control method of semiconductor memory device having memory cells from which data is read out depending on impedance between a terminal connected to a bit line and a source terminal, comprising: a step of applying a bias voltage between the terminals of the memory cells upon reading; and a step of not applying a bias voltage between the terminals of the memory cells upon standby for reading.

According to the present invention, although a first potential is applied to the bit line terminal of the memory cell during standby for reading, no second potential is applied to the source terminal. Thus, because no leak current is generated during standby for reading even if a memory cell in which the leak between S and D is likely to occur, the standby current can be suppressed to a small level.

The first potential and the second potential are complementary potentials and more specifically, power source potential and grounding potential can be mentioned. When the second potential is used as the grounding potential, the first potential may be a potential obtained by dropping the power source potential by an amount corresponding to the threshold voltage of the NMOS transistor. In this case, preferably the reading velocity can be accelerated because the amplitude of the voltage level is suppressed.

The memory cell may be of any type as long as it can read corresponding to impedance between the bit line terminal and source terminal and more specifically, mask ROM and EPROM can be mentioned.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, the semiconductor memory device of the preferred embodiment of the present invention will be described with reference to FIGS. 1-7.

Figure 1:
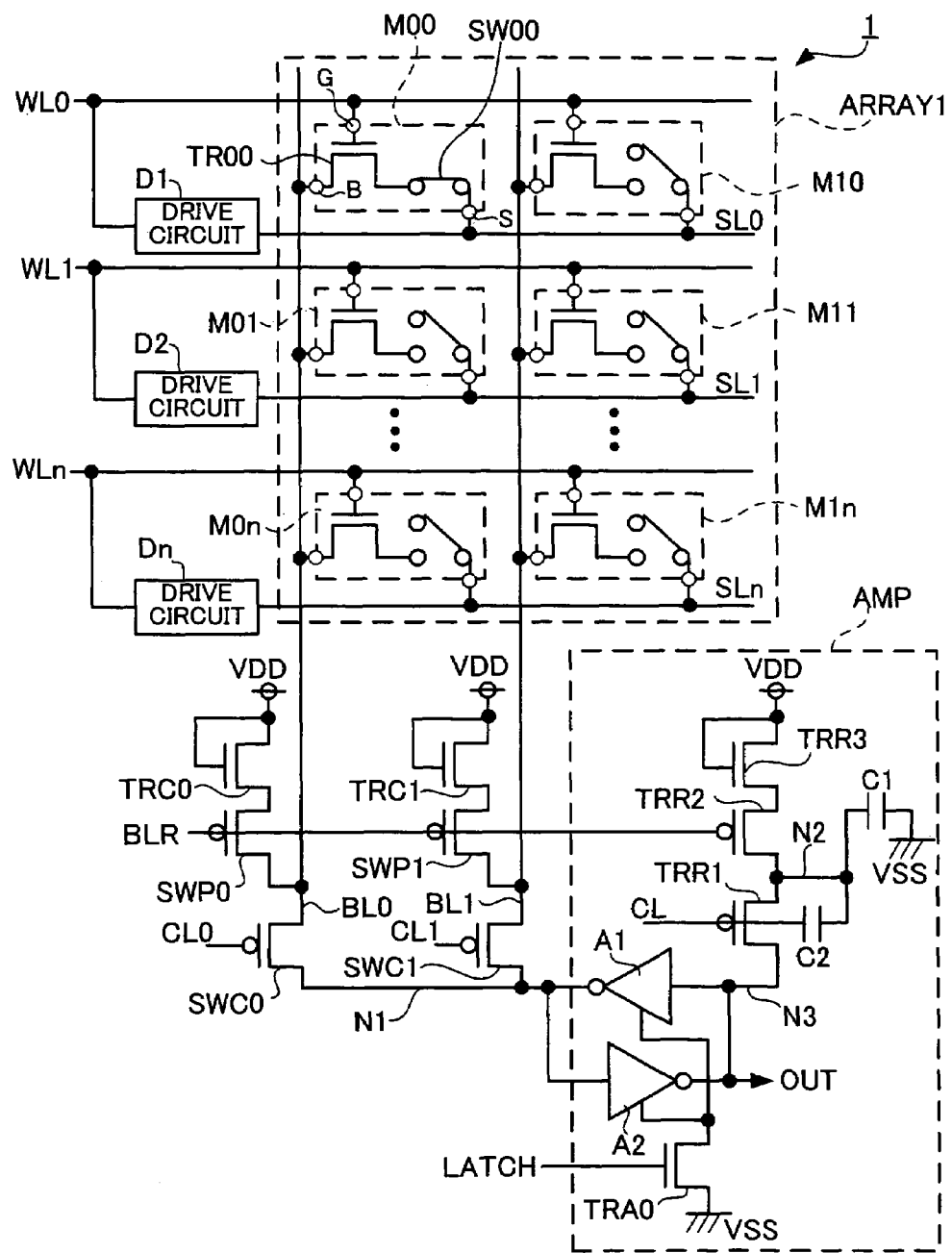
FIG. 1 is a circuit diagram of a ROM device of a first embodiment.

FIG. 1 is a circuit diagram showing the ROM device 1 of the first embodiment. The ROM device 1 is the same mask ROM as a conventional ROM device 100. Like the ROM device 100, this ROM device comprises bit line BL0 connected to memory cells M00-M0$n$, M10-M1$n$, bit line BL1 connected to memory cells M10-M1$n$ and word line WL0-WLn connected to row selecting transistors of the respective memory cells in the row direction (horizontal direction in FIG. 1).

The ROM device 1 includes a source power lines SL0-SLn connecting the source terminal S of the respective memory cells in the row direction and drive circuits D1-Dn receiving input from the word lines WL0-WLn and outputting to the source power lines SL0-SLn.

Figure 2:
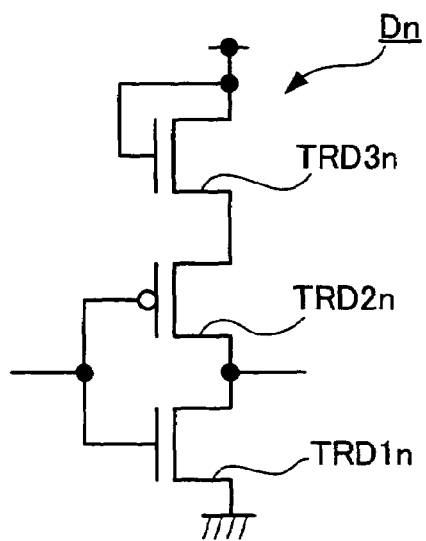
FIG. 2 is a specific example of a drive circuit.

FIG. 2 shows a specific example of the drive circuit Dn. The drive circuit Dn includes an inverter comprising an NMOS transistor TRD1$n$ and PMOS transistor TRD2$n$ and an NMOS transistor TRD3$n$ which is provided between the power source side of the inverter and a power source potential VDD while its gate is connected to the power source potential VDD. With this circuit structure, the drive circuit Dn outputs low level when high level is inputted to the gate and outputs a pre-charge level of potential of power source potential VDD-threshold voltage Vthn when low level is inputted to the gate.

Figure 3:
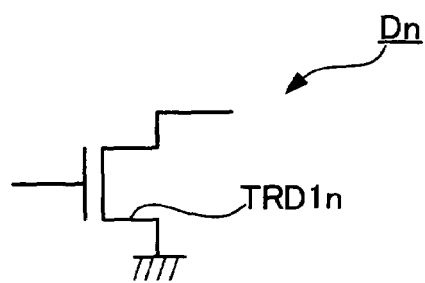
FIG. 3 is another example of the drive circuit.

As the drive circuit Dn, the circuit shown in FIG. 3 can be used. The drive circuit Dn includes an NMOS transistor TRD1$n$ and it outputs low level when high level is inputted to the gate and when low level is inputted, it outputs high impedance.

In any of the aforementioned drive circuits Dn (shown in FIGS. 2, 3), the word line WLn turns to high level upon reading operation while low level is supplied to a source terminal S of the memory cell.

Upon standby for reading (pre-charge), the word line WL turns to low level and if the drive circuit Dn shown in FIG. 2 is used, pre-charge level is outputted and if the drive circuit Dn shown in FIG. 3 is used, high impedance is outputted. In the former case, the potential becomes equal to the potential on the bit line side and in the latter case, a current passage is shut down, so that no current flows in the memory cell.

Returning to FIG. 1, description is continued. An NMOS transistor TRC0 in which power source potential VDD is connected to a gate thereof and a pre-charge switch SWP0 in which bit line control signal BLR is connected to a gate thereof are provided between the bit line BL0 and the power source potential VDD. The potential at a connecting point between the NMOS transistor TRC0 and the pre-charge switch SWP0 becomes power source potential VDD-threshold voltage Vthn. Here, the threshold voltage Vthn is a threshold voltage of the NMOS transistor TRC0. Thus, the bit line control signal BLR changes to low level and when the pre-charge switch SWP0 becomes conductive, the voltage of power source potential VDD—threshold voltage Vthn is applied to the bit line BL0 and pre-charge is executed with this voltage. Further, an end of a column switch SWC0 in which a column control signal CL0 is connected to a gate thereof is connected to the bit line BL0.

Further, an NMOS transistor TRC1 in which the power source potential VDD is connected to a gate thereof and a pre-charge switch SWP1 in which the bit line control signal BLR is connected to a gate thereof are provided between the bit line BL1 and the power source potential VDD. An end of a column switch SWC1 in which a column control signal CL1 is connected to a gate thereof is connected to the bit line BL1. The bit line BL1 is pre-charged with the voltage of the power source potential VDD—threshold voltage Vthn when the bit line control signal BLR becomes low level like the bit line BL0.

The other ends of the column switch SWC0 and the column switch SWC1 are connected to each other through a connecting point N1. As a consequence, of the column switches SWC0 and SWC1, one column switch in which the column control signal CL0 or the column control signal CL1 turns to low level becomes conductive so as to form a selecting switch for transmitting the potential of a corresponding bit line to the connecting point N1.

A sense amplifier surrounded with dotted line frame in FIG. 1 is constituted of an upper half reference cell portion and a lower half latch type amplifier portion.

In the reference cell portion, an NMOS transistor TRR3, a switch TRR2 and a capacitor C1 are provided between the power source potential VDD and grounding potential VSS. An end of a switch TRR1 in which a column signal CL which is a logical addition signal of column control signals CL0-CL1 is connected to a gate thereof and an end of the capacitor C2 are connected to a connecting point N2 between the switch TRR2 and the capacitor C1. The other end of the capacitor C2 is connected to the column signal CL.

In the reference cell portion, the capacitance values of the capacitors C1 and C2 are set so that the potential at the connecting point N2 between the capacitor C1 and the capacitor C2 becomes an intermediate potential between high level and low level of the bit line.

for an amplifier portion, inputs and outputs of a first amplifier A1 and a second amplifier A2 are cross-coupled with each other and an input side of the second amplifier A2 is connected to a connecting point N1 between the column switches SWC0 and SWC1 and an input side of the first amplifier A1 is connected to a connecting point N3 which is connected to the other end of the switch TRR1. When the latch signal LATCH changes from low level to high level, the transistor TRA0 becomes conductive so that control input of the first amplifier A1 and the second amplifier A2 becomes low level. As a consequence, the first amplifier A1 and the second amplifier A2 function as a latch so as to maintain the potentials of the connecting point N1 and the connecting point N3. Further, the maintained potentials of the connecting point N1 or the connecting point N3 are outputted to outside through a buffer circuit (not shown) as read out data.

Figure 4:
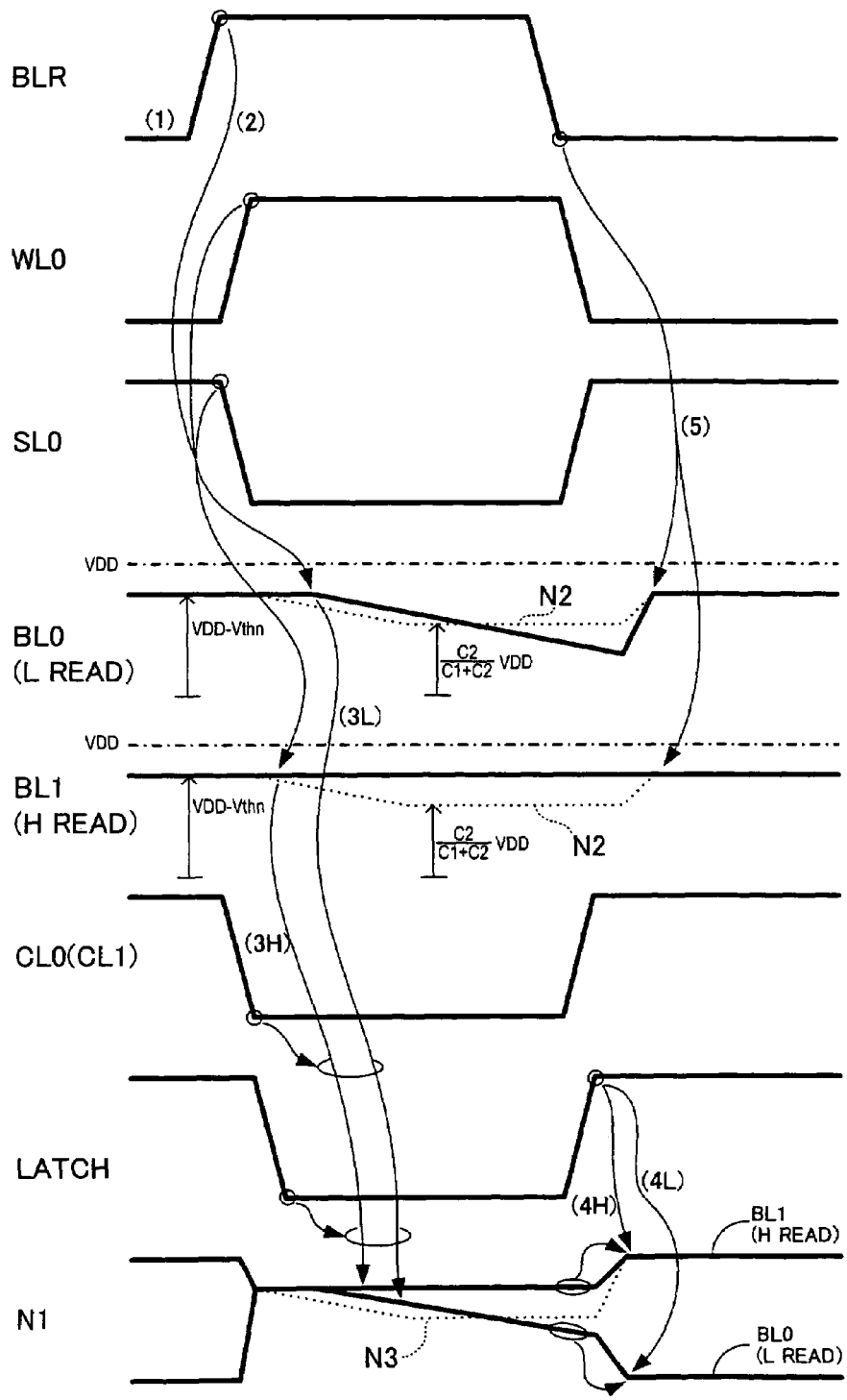
FIG. 4 is a timing chart of an operation of the ROM device of the first embodiment.

The operation of the ROM device 1 will be described with reference to a timing chart of FIG. 4.

Because the bit line control signal BLR is on low level in (1), the NMOS transistors TRC0, TRC1, TRR3 become conductive and the bit lines BL0, BL1 and the connecting point N2 are pre-charged with the voltage of power source potential VDD-threshold voltage Vthn.

In (2), the bit line control signal BLR and a word line WL0 change to high level. The source power line SL0 changes to low level which is a complementary level to the word line WL0 because the drive circuit D1 has inverted logic. Data of memory cell M00 is outputted to the bit line BL0 and data of memory cell M01 is outputted to the bit line BL1. The bit line BL0 maintains pre-charge voltage level (VDD-Vthn) because in the bit line BL1, the row selecting transistor TR00 becomes conductive while the data switch SW00 is non-conductive. On the other hand, in the bit line BL1, its voltage level drops gradually from the pre-charge voltage level toward the grounding potential VSS because in the memory cell M01, the row selecting transistor TR01 and the data switch SW01 become conductive.

Dotted line in the waveform of the bit lines BL0, BL1 indicate the potential of the connecting point N2. When the bit line control signal BLR changes to high level, the potential of the connecting point N2 drops from the pre-charge voltage level toward the potential of C2/(C1+C2)×VDD, which the power potential VDD is divided by the capacitors C1 and C2.

(3L), (4L) show the waveform for reading out the bit line BL0 and (3H), (4H) show the waveform for reading out the bit line BL1.

In (3L), when the column control signal CL0 changes to low level, the column switch SWC0 becomes conductive. Because the transistor TRA0 becomes non-conductive when the latch signal LATCH changes to low level, the first amplifier A1 and the second amplifier A2 get into high impedance state. As a consequence, the voltage level of the bit line BL0 is outputted to the connecting point N1 and the voltage level of the connecting point N2 is outputted to the connecting point N3.

In (3H), the column control signal CL1 and the latch signal LATCH change to low level like in (3L) so that the column switch SWC1 becomes conductive and the first amplifier A1 and the second amplifier A2 get into high impedance state. As a consequence, the voltage level of the bit line BL1 is outputted to the connecting point N1 and the voltage level of the connecting point N2 is outputted to the connecting point N3.

In (4L) and (4H), when the latch signal LATCH changes to high level, the transistor TRA0 becomes conductive so that the first amplifier A1 and the second amplifier A2 function as a latch. The connecting point N1 and the connecting point N3 are determined depending on the status of each voltage level when they function as a latch. That is, in case of (4L), the potential of the connecting point N1 is maintained at low level because the voltage level of the connecting point N1 is lower than the connecting point N3. On the other hand, in case of (4H), the potential of the connecting point N1 is maintained at high level because the voltage level of the connecting point N1 is higher than the connecting point N3.

In (5), when the bit line control signal BLR changes to low level, the pre-charge switches SWP0, SWP1 become conductive while the column switches SWC0 and SWC1 become non-conductive, so that the potential of the bit lines BL0, BL1 returns to pre-charge level (VDD-Vthn). Additionally, the source power lines SL0-SLn turn to a voltage level similar to the pre-charge level.

In the ROM device 1 of the first embodiment, the voltage level of the source power lines SL0-SLn becomes equal to the pre-charge level upon standby as indicated in (1)-(5) and the bit line terminal B and the source terminal S of the memory cells M00-M1$n$ become equal to each other. Therefore, even if the data switch in the memory cell is conductive so that leakage between S and D is likely to occur in the row selecting transistor, no current flows between the bit line terminal B and the source terminal S. That is, the ROM device 1 of the present invention can suppress standby current to a small level because no leak current is generated upon standby.

Next, a ROM device 1A according to the second embodiment will be described with reference to FIG. 5. The ROM device 1A includes memory cells M000-M1F7 disposed on the columns and rows. The memory cells M000-M1F7 have the same internal circuit as the memory cell of the first embodiment and eight pieces are disposed in the column direction (vertical direction in FIG. 5) while 32 pieces are disposed in the row direction (right and left direction in FIG. 5) so as to form a memory array ARRAY1A. Although this ROM device 1 possesses a pre-charge circuit and sense amplifier circuit which output from the column selector, description thereof is omitted.

In the memory array ARRAY1A, the bit lines BL00-BLLF are connected to memory cells, on the same column and the word lines WL00-WL13 are connected to memory cells on the same row. A source power line SL0 is connected to memory cells to which word lines WL00-WL03 are connected in the row direction and a source power line SL1 is connected to memory cells to which word lines WL10-WL13 are connected in the row direction. At every 16 memory cells in the row direction, column direction connecting lines LC1-3 for connecting the source power line SL0 in the column direction are disposed and column direction connecting lines LC4-6 for connecting the source power line SL1 are disposed in the column direction.

The ROM device 1A includes a first row decoder 20, a second row decoder 30, gate circuits 10-13, 15-18 and drive circuits 14, 19.

Figure 6:
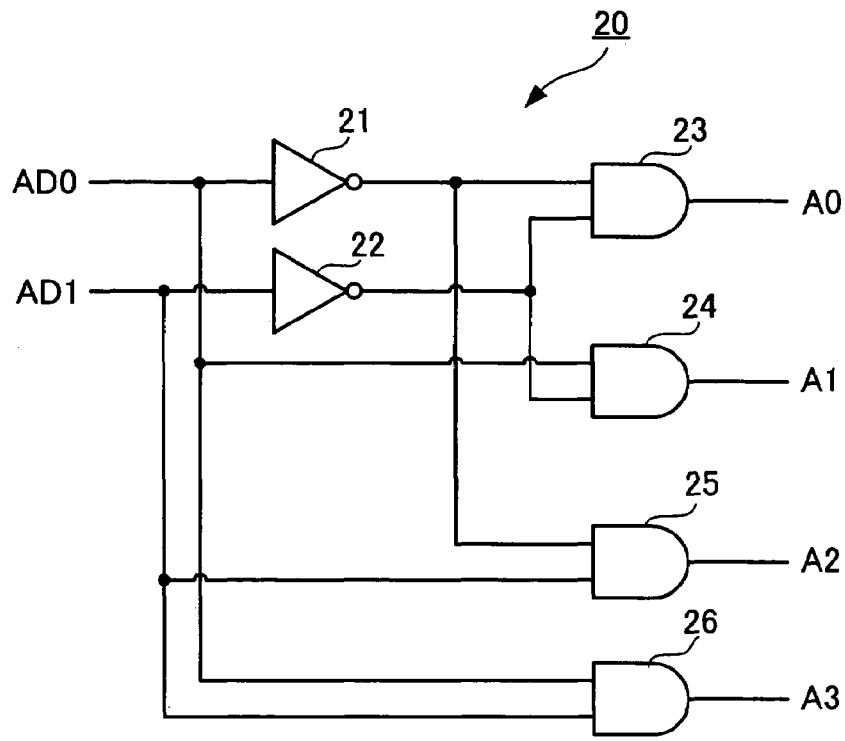
FIG. 6 is a specific example of a first row decoder.

The first row decoder 20 receives addresses AD0, AD1 as input and outputs decode signals A0-A3. FIG. 6 is a circuit diagram showing a specific example of the first row decoder 20. The first row decoder 20 includes inverters 21-22 and gate circuits 23-26. A combination of addresses AD0, AD1 and signals inverted through the inverters 21, 22 is inputted to the gate circuits 23-26. As a consequence, decode signals A0-A3 corresponding to all combinations of bits of the addresses AD0, AD1 are outputted.

Figure 7:
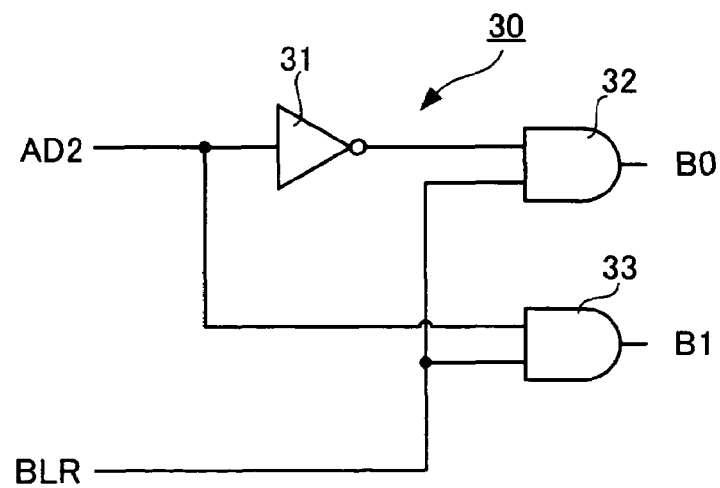
FIG. 7 is a specific example of a second row decoder.
Figure 8:
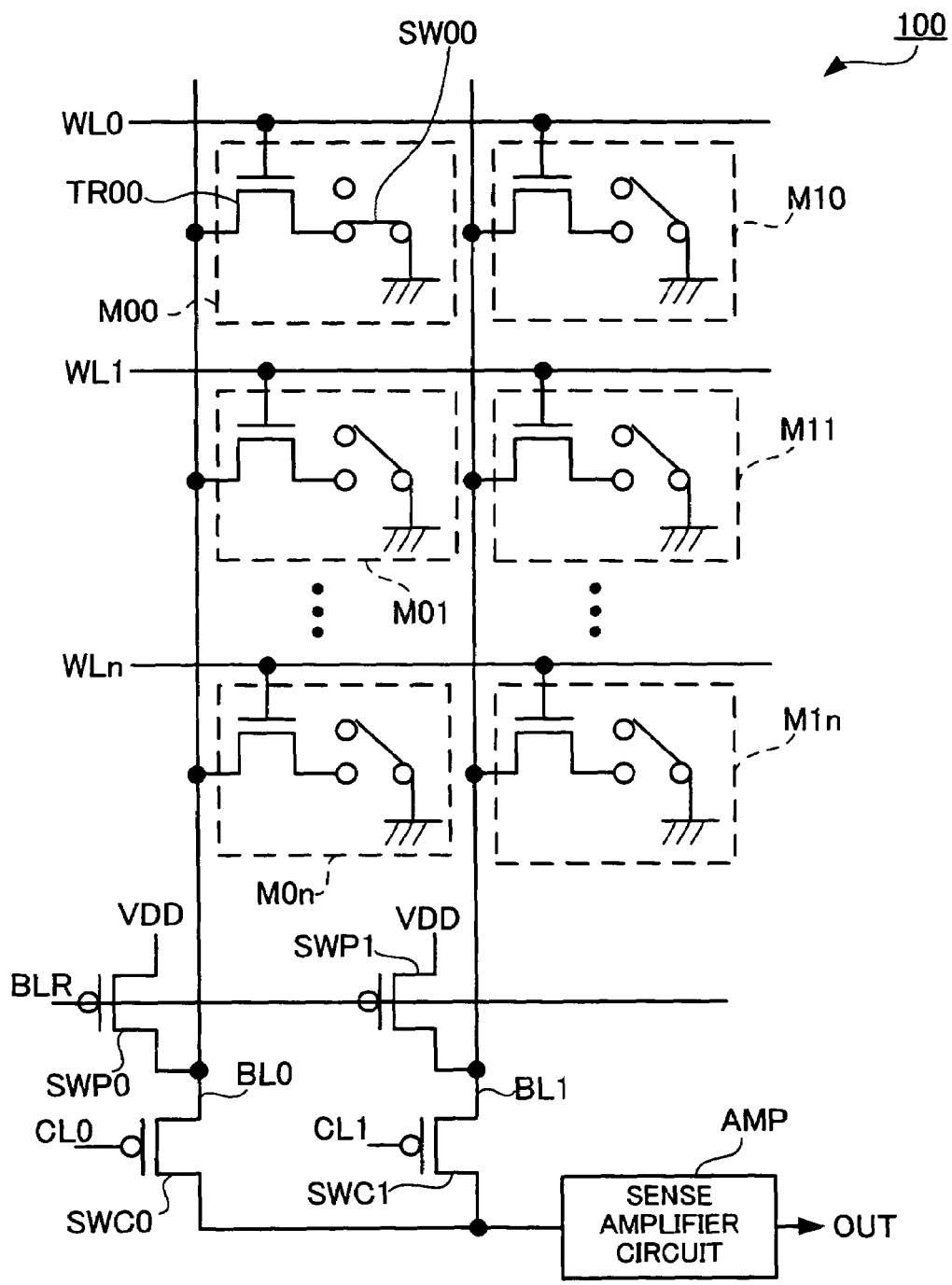
FIG. 8 is a circuit diagram of a conventional ROM device.

A second row decoder 30 receives an address AD3 and a bit line control signal BLR as input and outputs decode signals B0, B1. FIG. 7 shows a specific example of the second row decoder 30. The second row decoder 30 includes an inverter 31 and gate circuits 32, 33. The gate circuit 32 computes logical product of the address AD2 and the bit line control signal BLR and outputs its result to the decode signal B0. The gate circuit 33 computes logical product of an inverted signal of the address AD2 and the bit line control signal BLR and outputs its result to the decode signal B1.

Figure 5:
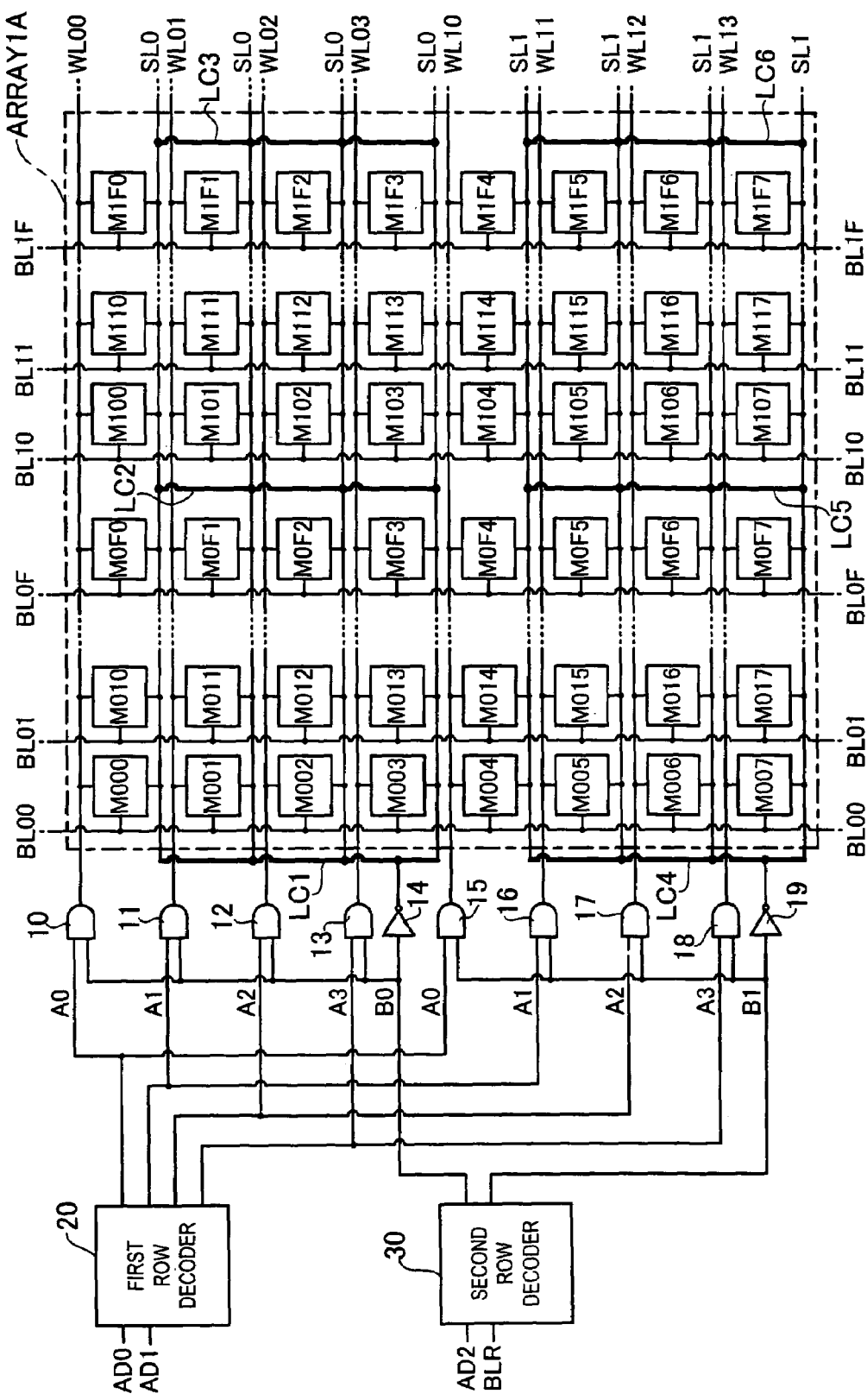
FIG. 5 is a circuit diagram of a ROM device of a second embodiment.

As shown in FIG. 5, a decode signal B0 and decode signals A0-A3 are inputted to the gate circuits 10-13 and a logical product of each combination is outputted to the word lines WL00-WL03. A combination of decode signal B1 and decode signals A0-A3 are inputted to the gate circuits 15-18 and a logical product of each combination is outputted to the word lines WL10-WL13.

The drive circuits 14, 19 have the same internal structure as the drive circuit Dn of the first embodiment. The drive circuit 14 receives a decode signal B0 as an input and outputs an inverted logic to the source power line SL0. The drive circuit 19 receives a decode signal B1 as an input and outputs an inverted logic to the source power line SL1. That is, the source power lines SL0, SL1 operate on a complementary level to the decode signals B0, B1.

The ROM device 1A of the second embodiment includes a second row decoder 30 for decoding an upper address AD2 to the addresses AD0, AD1 and the source power lines SL0, SL1 are driven by inverted logic of decode signals B0, B1 which are outputs of the second row decoder 30. That is, because an output of the second row decoder 30 is used to generate the source power lines SL0, SL1, generation of the source power lines SL0, SL1 can be executed with a simple circuit thereby preventing an increase of the size of the circuit.

Four source power lines SL0 disposed on each row in which each of the memory cells M000-M003 is located at the head are arranged adjacent to each other and four source power lines SL1 disposed on each row in which each of the memory cells M004-M007 is located at the head are arranged adjacent to each other. As a result, the source power lines SL0 and the source power lines SL1 are arranged without overlapping thereby simplifying the layout.

The ROM device 1A includes column direction connecting lines LC1-3 for connecting the source power lines SL0, SL1. As a consequence, transmission impedance of the source power lines SL0 on different rows can be equalized, preventing the voltage level of the source power line from rising when reading only a specific row even if a number of row data provided by making a data switch in the memory cell conductive are contained in the same row. As a result, the ROM device 1A which operates securely can be obtained.

The source power lines SL1 are connected in the column direction with the column direction connecting lines LC4-6 like the source power line SL0. Thus, the same effect as the source power line SL0 is exerted.

In the meantime, the present invention is not restricted to the above-described embodiments but needless to say, the present invention may be improved or modified in various ways within a scope not departing from the spirit of the present invention.

According to the first embodiment, the capacitors C1, C2 are adjusted proportionally to generate the potential at the connecting point N2. Instead, it is permissible to construct a proportional adjusting circuit using a resistor so as to generate the potential of the connecting point N2.

The first embodiment indicates an example of using a row selecting transistor TR00 constituted of NMOS transistor. Instead, the row selecting transistor may be constructed using PMOS transistor.

In the meantime, the NMOS transistor TRC0, TRC1 are an example of the first NMOS transistor, the NMOS transistor TRD3n is an example of the second NMOS transistor and the decode signals B0, B1 are an example of the intermediate decode signal.

Applying the present invention can provide a semiconductor memory device capable of suppressing standby current to a small level.

What is claimed is:

1. A semiconductor memory device comprising:
a plurality of memory cells from each of which data is read out depending on impedance between a terminal connected to a bit line and a source terminal,
a plurality of word lines each one of which is connected in common to gate terminals of a plurality of the memory cells;
a plurality of source lines each one of which is individually provided for each one of the word lines, each source line being biased when each word line is biased and being connected in common to source terminals of a plurality of the memory cells of which the gate terminals are connected to each word line; and
a drive circuit for driving each one of the source lines and electrically coupling each one of the source lines with each one of the word lines.

2. The semiconductor memory device according to claim 1, wherein each memory cell includes a row selecting transistor and a data switch that are provided between the terminal connected to the bit line and the source terminal, and the row selecting transistor controlled by the word line and the data switch set preliminarily to conductive or non-conductive.

3. The semiconductor memory device according to claim 1, wherein upon standby for reading, each source line and the bit line are brought to the same potential.

4. The semiconductor memory device according to claim 3 further comprising:
a first NMOS transistor that is provided on a passage leading from a power source potential to the bit line while its gate is connected to a high potential side terminal; and
a second NMOS transistor that is provided on a passage leading from the power source potential to each source line while its gate is connected to a high potential terminal.

5. The semiconductor memory device according to claim 1, wherein upon standby for reading, each source line is brought to high impedance.

6. The semiconductor memory device according to claim 1, wherein upon reading, a level complementary to each word line for selecting the memory cell is applied to the corresponding source line.

7. The semiconductor memory device according to claim 1 further comprising:
a source line decoder for decoding part of address groups that identify the word line wherein the corresponding source line is selected by the source line decoder.

8. The semiconductor memory device according to claim 7, wherein a plurality of selected source lines are disposed physically adjacent to each other.

9. The semiconductor memory device according to claim 8 further comprising:
a source connecting line for connecting the selected plural source lines.

10. The semiconductor memory device according to claim 7, wherein the part of the address groups is a bit string continuing from the highest bit.

11. The semiconductor memory device according to claim 10, wherein the selected source lines are disposed physically adjacent to each other.

12. The semiconductor memory device according to claim 11 further comprising:
a source connecting line for connecting the selected plural source lines.

13. A control method of semiconductor memory device having a plurality of memory cells from which data is read out depending on impedance between a terminal connected to a bit line and a source terminal, comprising:
biasing a plurality of word lines each one of which is in connected in common to gate terminals of a plurality of the memory cells;
biasing a plurality of source lines each one of which is individually provided for each one of the word lines, each source line being biased when each word line is biased and being connected in common to source terminals of a plurality of the memory cells of which the gate terminals are connected to each word line, and a step of driving each source line with a drive circuit electrically coupled with one of the word lines.

14. The control method of semiconductor memory device according to claim 13, further comprising:

bringing the source terminal and the bit line to the same potential upon standing for reading.

15. The control method of semiconductor memory device according to claim 14, further comprising:

bringing the source terminal to high impedance upon standby for reading.

* * * * *